US010439076B2

(12) United States Patent
Chien et al.

(10) Patent No.: US 10,439,076 B2
(45) Date of Patent: Oct. 8, 2019

(54) OPTICAL DETECTING DEVICE AND OPTICAL PACKAGE STRUCTURE

(71) Applicant: ANPEC ELECTRONICS CORPORATION, Hsinchu (TW)

(72) Inventors: Chih-Cheng Chien, New Taipei (TW); Jane-Wang Lai, Hsinchu (TW); Chien-Chung Hsiao, Taoyuan (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/978,451

(22) Filed: May 14, 2018

(65) Prior Publication Data

US 2019/0259882 A1 Aug. 22, 2019

(30) Foreign Application Priority Data

Feb. 21, 2018 (TW) .............................. 107105770 A

(51) Int. Cl.
*H01L 31/02* (2006.01)
*H01L 23/13* (2006.01)
*H01L 31/0203* (2014.01)

(52) U.S. Cl.
CPC ........ *H01L 31/02005* (2013.01); *H01L 23/13* (2013.01); *H01L 31/0203* (2013.01)

(58) Field of Classification Search
CPC ........... H01L 31/02005; H01L 31/0203; H01L 23/13
See application file for complete search history.

(56) References Cited

U.S. PATENT DOCUMENTS

| 5,656,847 A | * | 8/1997 | Okazaki | H01L 33/44 257/100 |
| 5,949,655 A | * | 9/1999 | Glenn | H01L 23/04 361/783 |
| 6,034,424 A | * | 3/2000 | Fujimura | G02B 6/4204 257/696 |
| 6,326,242 B1 | * | 12/2001 | Brooks | H01L 23/36 257/E23.092 |

(Continued)

FOREIGN PATENT DOCUMENTS

CN 106057778 A 10/2016

*Primary Examiner* — Sitaramarao S Yechuri
(74) *Attorney, Agent, or Firm* — Li & Cai Intellectual Property (USA) Office

(57) ABSTRACT

An optical package structure includes a first conductive frame, a second conductive frame, a light receiver, and a light-permeable package compound. The first and second conductive frames are arranged apart from each other and have a light entrance there-between. The light receiver includes a light receiving region and two soldering portions arranged on a surface thereof. The two soldering portions are respectively arranged at two opposite sides of the light receiving region, and are respectively soldered onto the first and second conductive frames, such that the light receiving region faces the light entrance. At least part of the first conductive frame, at least part of the second conductive frame, and the light receiver are embedded in the light-permeable package compound. The light receiver is configured to receive a light signal traveling through the light-permeable package compound and the light entrance.

9 Claims, 3 Drawing Sheets

(56) References Cited

U.S. PATENT DOCUMENTS

| | | | | |
|---|---|---|---|---|
| 6,707,148 | B1* | 3/2004 | Mostafazedeh | H01L 27/15 257/432 |
| 7,629,660 | B2* | 12/2009 | Bauer | H01L 23/3135 250/216 |
| 8,616,787 | B2* | 12/2013 | Matsuo | G02B 6/4292 385/89 |
| 2002/0020923 | A1* | 2/2002 | Kanatake | H01L 21/56 257/778 |
| 2004/0182591 | A1* | 9/2004 | Kawamura | H01L 31/0203 174/529 |
| 2005/0056769 | A1* | 3/2005 | Chen | H01L 27/14618 250/208.1 |
| 2005/0151217 | A1* | 7/2005 | Shirakawa | G11B 7/13 257/433 |
| 2005/0270404 | A1 | 12/2005 | Honboh et al. | |
| 2006/0118927 | A1* | 6/2006 | Verma | G06K 19/072 257/676 |
| 2006/0181638 | A1* | 8/2006 | Shinomiya | H01L 27/14618 348/374 |
| 2007/0200817 | A1 | 8/2007 | Tsai et al. | |
| 2008/0197459 | A1* | 8/2008 | Fauty | H01L 21/561 257/666 |
| 2012/0267771 | A1* | 10/2012 | Zohni | H01L 23/4951 257/676 |
| 2014/0211472 | A1* | 7/2014 | Hata | H01L 31/0203 362/259 |
| 2016/0233156 | A1* | 8/2016 | Song | G06F 13/28 |

\* cited by examiner

OPTICAL DETECTING DEVICE AND OPTICAL PACKAGE STRUCTURE

BACKGROUND OF THE DISCLOSURE

Field of the Disclosure

The present disclosure relates to a detecting device; in particular, to an optical detecting device and an optical package structure.

Description of Related Art

Reference is made to FIG. 1, which illustrates a conventional optical package structure 100a including two conductive frames 1a, a light receiver 2a, a plurality of metal wires 3a, a plurality of silver glues 4a, and a light-permeable package compound 5a. The light receiver 2a is mounted on one of the two conductive frames 1a, and is electrically connected to the two conductive frames 1a by the metal wires 3a. The connecting junction of each of the two conductive frames 1a and the corresponding metal wire 3a is covered (or embedded) in one of the silver glues 4a, thereby enhancing the connecting strength thereof. The light receiver 2a, the metal wires 3a, the silver glues 4a, and part of each of the two conductive frames 1a are embedded in the light-permeable package compound 5a.

However, when the conventional optical package structure 100a is soldered on a circuit board 200a, since the components of the conventional optical package structure 100a have thermal expansion coefficients with different values, the silver glues 4a can easily peel off and the metal wires 3a can easily break. Moreover, a flaw in any one of the metal wires 3a may cause the entire conventional optical package structure 100a to be a defective product.

SUMMARY OF THE DISCLOSURE

The present disclosure provides an optical detecting device and an optical package structure to solve the drawbacks associated with conventional optical package structures.

The present disclosure provides an optical detecting device, which includes an optical package structure and a circuit board. The optical package structure includes a first conductive frame, a second conductive frame, a light receiver, and a light-permeable package compound. The first conductive frame includes a first base portion, a first die-bonding portion, and a first exposed portion. The first die-bonding portion and the first exposed portion respectively extend from two opposite ends of the first base portion. The second conductive frame includes a second base portion and a second die-bonding portion extending from the second base portion. The first die-bonding portion and the second die-bonding portion are spaced apart from and substantially coplanar with each other. The first die-bonding portion and the second die-bonding portion jointly define a light entrance therebetween. The light receiver has a first surface and a second surface opposite to the first surface. The light receiver includes a light receiving region and two soldering portions. The light receiving region and the two soldering portions are arranged on the first surface, and the two soldering portions are respectively arranged at two opposite sides of the light receiving region. The two soldering portions of the light receiver are respectively soldered on the first die-bonding portion and the second die-bonding portion, such that the light receiving region faces the light entrance. The first die-bonding portion, the first base portion, the second die-bonding portion, the second base portion, and the light receiver are embedded in the light-permeable package compound. The first exposed portion of the first conductive frame is soldered on the circuit board. The light receiver is configured to receive a light signal traveling through the light-permeable package compound and the light entrance, and is configured to transmit an electrical signal to the circuit board through the first conductive frame.

The present disclosure also provides an optical package structure, which includes a first conductive frame, a second conductive frame, a light receiver, and a light-permeable package compound. The first conductive frame includes a first base portion, a first die-bonding portion, and a first exposed portion. The first die-bonding portion and the first exposed portion respectively extend from two opposite ends of the first base portion. The second conductive frame includes a second base portion and a second die-bonding portion extending from the second base portion. The first die-bonding portion and the second die-bonding portion are spaced apart from and substantially coplanar with each other. The first die-bonding portion and the second die-bonding portion jointly define a light entrance therebetween. The light receiver has a first surface and a second surface opposite to the first surface. The light receiver includes a light receiving region and two soldering portions. The light receiving region and the two soldering portions are arranged on the first surface, and the two soldering portions are respectively arranged at two opposite sides of the light receiving region. The two soldering portions of the light receiver are respectively soldered on the first die-bonding portion and the second die-bonding portion, such that the light receiving region faces the light entrance. The first die-bonding portion, the first base portion, the second die-bonding portion, the second base portion, and the light receiver are embedded in the light-permeable package compound. The light receiver is configured to receive a light signal traveling through the light-permeable package compound and the light entrance.

In summary, each of the optical detecting device and the optical package structure of the present disclosure is formed by respectively soldering the two soldering portions of the light receiver onto the first conductive frame and the second conductive frame, such that the components embedded in the light-permeable package compound can be provided without any silver glue or metal wire, effectively reducing defective rate of the optical package structures.

Moreover, since the light receiving region and the two soldering portions are arranged on the same surface of the light receiver, a gap (or a distance) between the first conductive frame and the second conductive frame can be formed corresponding in size to the light receiving region so as to be used as a light entrance. Accordingly, the light receiving region of the light receiver is configured to only receive a light signal passing through the light entrance, and other light signals are shielded by the first conductive frame and the second conductive frame.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE EXEMPLARY EMBODIMENTS

References are hereunder made to the detailed descriptions and appended drawings in connection with the present disclosure. However, the appended drawings are merely provided for exemplary purposes, and should not be construed as restricting the scope of the present disclosure.

First Embodiment

Figure 1:
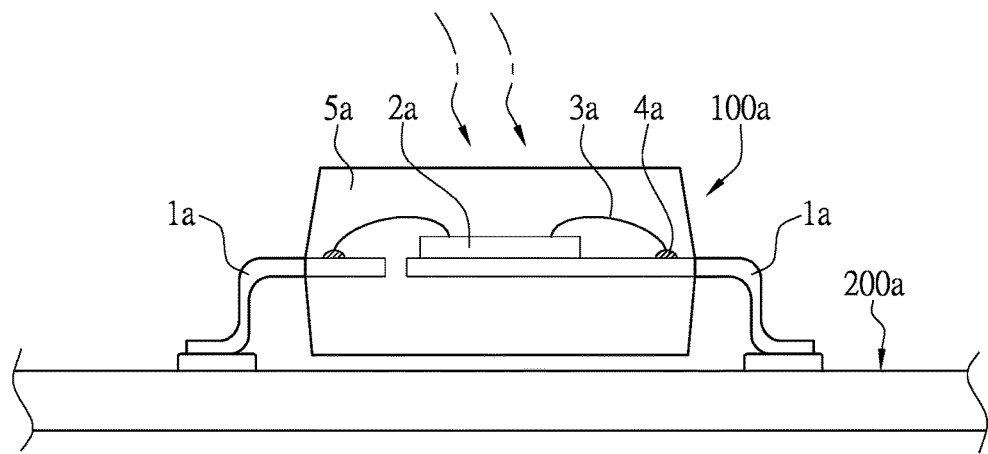
FIG. 1 is a schematic view showing a conventional optical package structure soldered on a circuit board.
Figure 2:
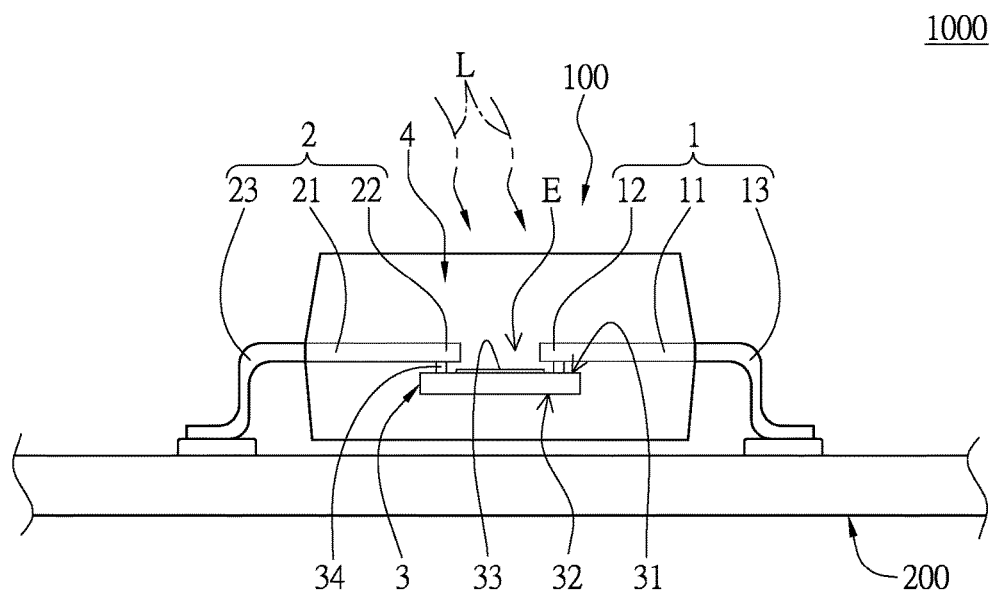
FIG. 2 is a schematic view showing an optical detecting device according to a first embodiment of the present disclosure.

Reference is made to FIG. 2, which illustrates a first embodiment of the present disclosure. The present embodiment discloses an optical detecting device 1000, and in particular, a side-by-side type optical detecting device 1000, but the present disclosure is not limited thereto. In other words, the optical detecting device 1000 of the present disclosure can be of a type different from the side by side type.

The optical detecting device 1000 includes an optical package structure 100 and a circuit board 200, and the optical package structure 100 is soldered on the circuit board 200. In the present embodiment, the optical package structure 100 can be partly inserted into and soldered on the circuit board 200, or can be soldered on the circuit board 200 by using surface mounting technology (SMT), but the present disclosure is not limited thereto.

It should be noted that the optical package structure 100 in the present embodiment cooperates with the circuit board 200, but the present disclosure is not limited thereto. In other words, the optical package structure 100 can be applied individually or applied to other devices according to design requirements.

The optical package structure 100 includes a first conductive frame 1, a second conductive frame 2, a light receiver 3, and a light-permeable package compound 4. The light receiver 3 is soldered on the first conductive frame 1 and the second conductive frame 2. The light receiver 3, at least part of the first conductive frame 1, and at least part of the second conductive frame 2 are embedded in the light-permeable package compound 4. Moreover, the optical package structure 100 in the present embodiment is preferably provided without any silver glue or metal wire arranged in the light-permeable package compound 4, but the present disclosure is not limited thereto. The following description discloses the structure and connection relationship of each component of the optical package structure 100.

In the present embodiment, the first conductive frame 1 and the second conductive frame 2 are spaced apart from each other and have the same thickness, and an outer contour of the first conductive frame 1 is substantially mirror-symmetrical with that of the second conductive frame 2, but the present disclosure is not limited thereto.

Specifically, the first conductive frame 1 in the present embodiment is integrally formed as a one-piece structure. The first conductive frame 1 includes a first base portion 11, a first die-bonding portion 12 extending from an end of the first base portion 11 (e.g., the left end of the first base portion 11 as shown in FIG. 2), and a first exposed portion 13 extending from an opposite end of the first base portion 11 (e.g., the right end of the first base portion 11 as shown in FIG. 2). Moreover, the second conductive frame 2 in the present embodiment is integrally formed as a one-piece structure. The second conductive frame 2 includes a second base portion 21, a second die-bonding portion 22 extending from an end of the second base portion 21 (e.g., the right end of the second base portion 21 as shown in FIG. 2), and a second exposed portion 23 extending from an opposite end of the second base portion 21 (e.g., the left end of the second base portion 21 as shown in FIG. 2).

The first die-bonding portion 12 of the first conductive frame 1 and the second die-bonding portion 22 of the second conductive frame 2 are spaced apart from and substantially coplanar with each other, and the first die-bonding portion 12 and the second die-bonding portion 22 jointly define a light entrance E therebetween. Furthermore, a distance (or the light entrance E) between the first die-bonding portion 12 and the second die-bonding portion 22 in the present embodiment is not only formed to electrically isolate the first conductive frame 1 from the second conductive frame 2, but also provided for light to pass therethrough.

The light receiver 3 in the present embodiment is a photodiode component, a photo transistor component, or a photo IC component, but the present disclosure is not limited thereto. The light receiver 3 has a first surface 31 and a second surface 32 opposite to the first surface 31. The light receiver 3 includes a light receiving region 33 and two soldering portions 34. The light receiving region 33 and the two soldering portions 34 are arranged on the first surface 31, and the two soldering portions 34 are respectively arranged at two opposite sides of the light receiving region 33.

Moreover, the two soldering portions 34 of the light receiver 3 are respectively soldered on the first die-bonding portion 12 and the second die-bonding portion 22, such that the light receiving region 33 faces the light entrance E. The light entrance E preferably corresponds in size to the light receiving region 33 of the light receiver 3. In other words, when the light receiver 3 is provided with a larger light receiving region 33, the light entrance E would also be formed with a larger size.

The light-permeable package compound 4 in the present embodiment is preferably a transparent package compound 4, and can be made of an epoxy resin, but the present disclosure is not limited thereto. The first die-bonding portion 12 and the first base portion 11 of the first conductive frame 1, the second die-bonding portion 22 and the second base portion 21 of the second conductive frame 2, and the light receiver 3 are (entirely) embedded in the light-permeable package compound 4. The first exposed portion 13 and the second exposed portion 23 are arranged to be exposed from of the light-permeable package compound 4. The light receiver 3 in the present embodiment is substantially arranged in a space surroundingly defined by the first conductive frame 1 and the second conductive frame 2.

Specifically, the optical package structure 100 is preferably provided without any opaque material arranged on an outer surface of the light-permeable package compound 4, but the present disclosure is not limited thereto. For example, in other embodiments of the present disclosure, the light-permeable package compound 4 can be formed with a light path for allowing light to arrive at the light receiver 3, and the optical package structure 100 can further include an opaque material arranged on a portion of the outer surface of the light-permeable package compound 4 other than the light path. In other words, an optical package structure having an opaque material arranged on the light path thereof is not the optical package structure 100 of the present disclosure.

The optical package structure 100 of the present embodiment has been disclosed in the above description, and the following description discloses the connection relationship between the optical package structure 100 and the circuit board 200.

The first exposed portion 13 of the first conductive frame 1 and the second exposed portion 23 of the second conductive frame 2 are soldered on the circuit board 200, and the light receiver 3 is arranged at one side of the first and second die-bonding portions 12, 22 (e.g., the lower side of the first and second die-bonding portions 12, 22 as shown in FIG. 2) adjacent to the circuit board 200, such that the second surface 32 of the light receiver 3 faces the circuit board 200. Moreover, the light receiver 3 is configured to receive a light signal L traveling through the light-permeable package compound 4 and the light entrance E, and is configured to transmit an electrical signal to the circuit board 200 through at least one of the first conductive frame 1 and the second conductive frame 2.

Second Embodiment

Figure 3:
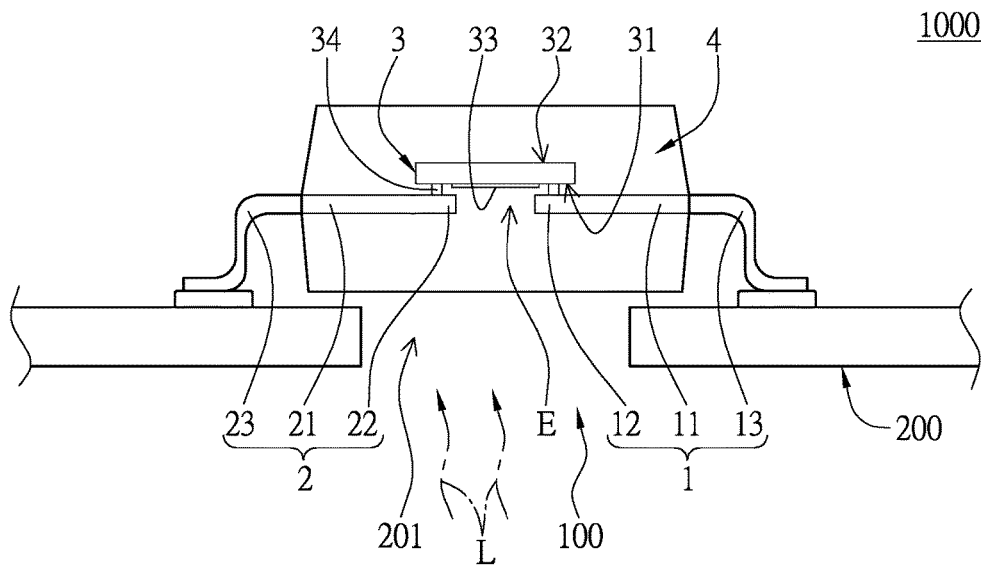
FIG. 3 is a schematic view showing an optical detecting device according to a second embodiment of the present disclosure.

Reference is made to FIG. 3, which illustrates a second embodiment of the present disclosure. The second embodiment is similar to the first embodiment, so that identical features or components of the two embodiments will not be disclosed in the following description. The difference between the second embodiment and the first embodiment is disclosed as follows.

The light receiver 3 is arranged at one side of the first and second die-bonding portions 12, 22 (e.g., the upper side of the first and second die-bonding portions 12, 22 as shown in FIG. 3) away from the circuit board 200. In other words, the light receiver 3 in the present embodiment is arranged out of a space surroundingly defined by the first conductive frame 1 and the second conductive frame 2. Moreover, the circuit board 200 has a thru-hole 201, and the first exposed portion 13 and the second exposed portion 23 are respectively soldered on two portions of the circuit board 200 that are arranged at two opposite sides of the thru-hole 201 (e.g., the right side and the left side of the thru-hole 201 as shown in FIG. 3).

Accordingly, the light receiving region 33 of the light receiver 3 faces the thru-hole 201, such that the light receiver 3 is configured to receive a light signal L traveling through the thru-hole 201, the light-permeable package compound 4, and the light entrance E.

It should be noted that the size and shape of the thru-hole 201 of the circuit board 200 in the present embodiment can be adjusted according to design requirements, and are not limited by FIG. 3. For example, the circuit board 200 can be formed as two sub circuit boards that are separated by extending the thru-hole 201. That is to say, a space between the two sub circuit boards is defined as the thru-hole 201, and the first exposed portion 13 and the second exposed portion 23 are respectively soldered on the two sub circuit boards.

Third Embodiment

Figure 4:
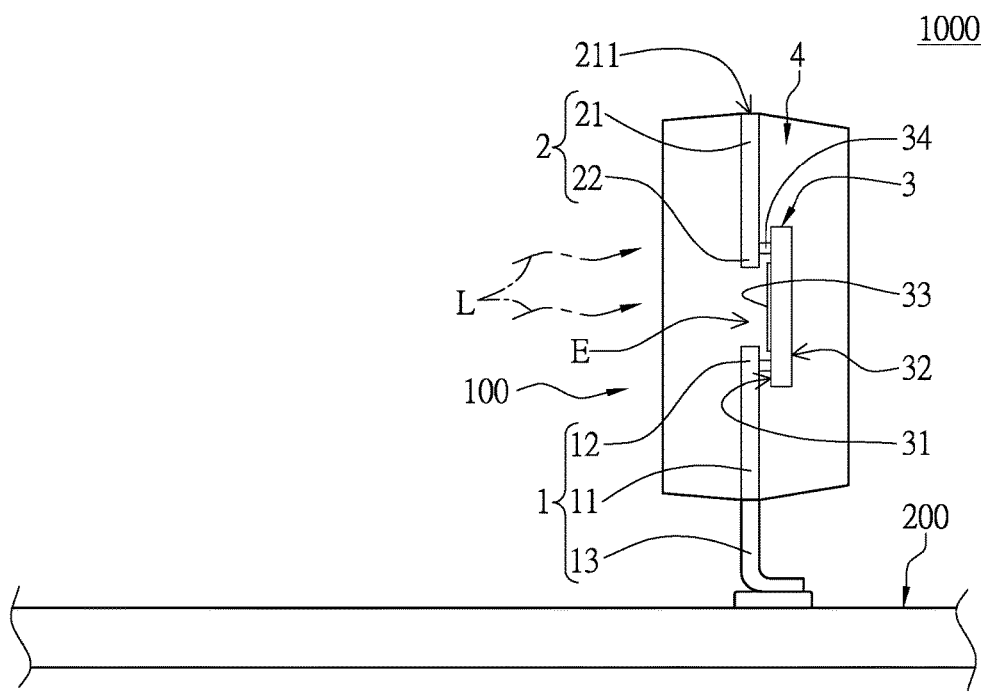
FIG. 4 is a schematic view showing an optical detecting device according to a third embodiment of the present disclosure.

Reference is made to FIG. 4, which illustrates a third embodiment of the present disclosure. The third embodiment is similar to the first embodiment, so that that identical features or components of the two embodiments (e.g., the light-permeable package compound 4 and the configuration embedded therein) will not be disclosed in the following description. The difference between the third embodiment and the first embodiment is disclosed as follows.

The second conductive frame 2 is not connected to (i.e., separate from) the circuit board 200. The second base portion 21 has a cut surface 211 arranged away from the second die-bonding portion 22 and substantially flush with an adjacent outer surface of the light-permeable package compound 4. In other words, the second conductive frame 2 only includes the second base portion 21 and the second die-bonding portion 22, but the present disclosure is not limited thereto.

Moreover, the optical package structure 100 in the present embodiment is fixed on the circuit board 200 only by the first exposed portion 13. An angle jointly defined by the light receiving region 33 and the circuit board 200 can be within a range of 80-100 degrees by adjusting the structure of the first exposed portion 13 with respect to the circuit board 200. The angle in the present embodiment is substantially 90 degrees, but the angle of the present disclosure can be adjusted according to design requirements.

Fourth Embodiment

Figure 5:
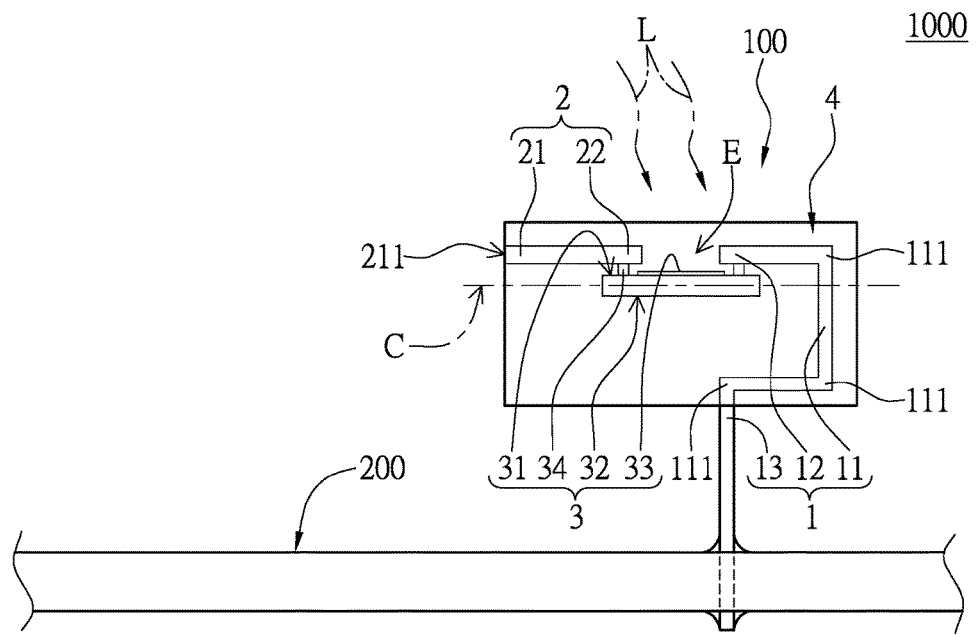
FIG. 5 is a schematic view showing an optical detecting device according to a fourth embodiment of the present disclosure.
Figure 6:
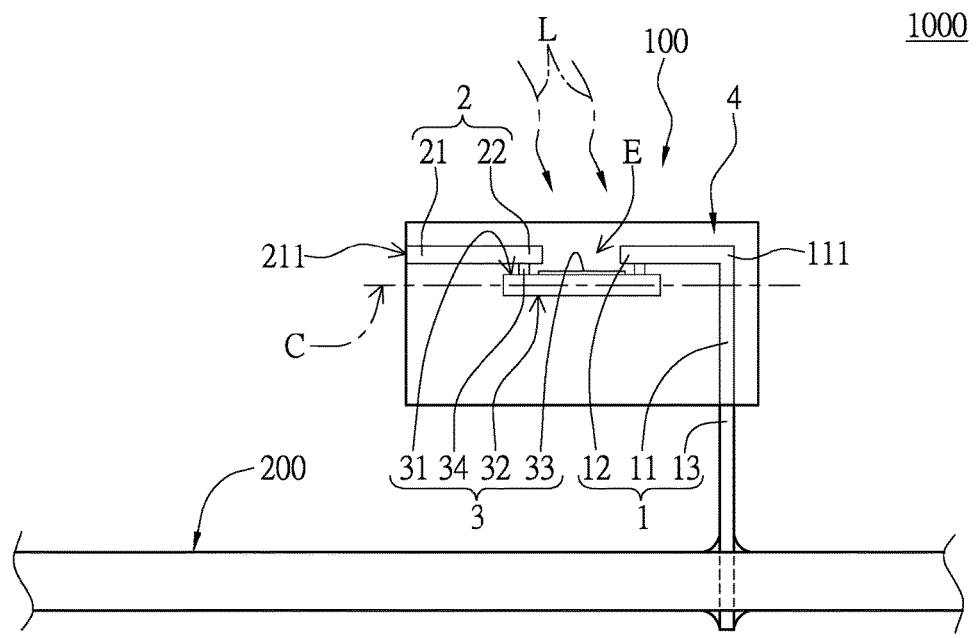
FIG. 6 is a schematic view showing an optical detecting device in another configuration according to the fourth embodiment of the present disclosure.

Reference is made to FIGS. 5 and 6, which illustrate a fourth embodiment of the present disclosure. The fourth embodiment is similar to the first embodiment, so that identical features or components of the two embodiments (e.g., the first die-bonding portion 12 and the first base portion 11 of the first conductive frame 1, the second die-bonding portion 22 and the second base portion 21 of the second conductive frame 2, and the light receiver 3) will not be disclosed in the following description. The difference between the fourth embodiment and the first embodiment is disclosed as follows.

The second conductive frame 2 is not connected to (i.e., separate from) the circuit board 200. The second base portion 21 has a cut surface 211 arranged away from the second die-bonding portion 22 and substantially flush with an adjacent outer surface of the light-permeable package compound 4. In other words, the second conductive frame 2 only includes the second base portion 21 and the second die-bonding portion 22, but the present disclosure is not limited thereto.

Moreover, the optical package structure 100 in the present embodiment is fixed on the circuit board 200 only by the first exposed portion 13. The light receiving region 33 can be substantially parallel to the circuit board 200 by adjusting the structure of the first exposed portion 13 with respect to the circuit board 200. Furthermore, the light receiving region 33 and the circuit board 200 can be formed with an angle therebetween, and the angle of the present disclosure can be adjusted according to design requirements.

Specifically, in a cross section C of the optical package structure 100 parallel to the light receiving region 33 and passing through the light receiver 3, a center of the shape of the light receiver 3 in the present embodiment is arranged apart from that of the light-permeable package compound 4, thereby allowing different applications thereof.

In other words, the light receiver 3 of the optical package structure 100 in the present embodiment can be offset from the light-permeable package compound 4 by adjusting the structure of the first conductive frame 1. For example, the first base portion 11 can be in a curved shape (e.g., the first base portion 11 has three corners 111 as shown in FIG. 5), and the light receiver 3 can be partially arranged in a space surroundingly defined by the first base portion 11. In addition, the curved first base portion 11 of the present embodiment can be formed with at least one corner 111 (as shown in FIG. 6), but the present disclosure is not limited thereto.

Moreover, the light receiver 3 is arranged at one side of the first and second die-bonding portions 12, 22 (e.g., the lower side of the first and second die-bonding portions 12, 22 as shown in FIG. 5) adjacent to the circuit board 200, and the second surface 32 of the light receiver 3 faces the circuit board 200.

Technical Effects of the Present Embodiments

In summary, each of the optical detecting device and the optical package structure of the present disclosure is formed by respectively soldering the two soldering portions of the light receiver onto the first conductive frame and the second conductive frame, such that the components embedded in the light-permeable package compound can be provided without any silver glue or metal wire, effectively reducing fail probability of the optical package structure.

Moreover, since the light receiving region and the two soldering portions are arranged on the same surface of the light receiver, a gap (or a distance) between the first conductive frame and the second conductive frame can be formed corresponding in size to the light receiving region so as to be used as a light entrance. Accordingly, the light receiving region of the light receiver is configured to only receive a light signal passing through the light entrance, and other light signals are shielded by the first conductive frame and the second conductive frame.

In addition, the optical detecting device of the present disclosure can be implemented according to different design requirements by adjusting the structure of the components thereof as disclosed in the above first to fourth embodiments.

The descriptions illustrated supra set forth simply the exemplary embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An optical detecting device, comprising:
    an optical package structure including:
        a first conductive frame including a first base portion, a first die-bonding portion, and a first exposed portion, wherein the first die-bonding portion and the first exposed portion respectively extend from two opposite ends of the first base portion;
        a second conductive frame including a second base portion and a second die-bonding portion extending from the second base portion, wherein the first die-bonding portion and the second die-bonding portion are spaced apart from and substantially coplanar with each other, and the first die-bonding portion and the second die-bonding portion jointly define a light entrance therebetween;
        a light receiver having a first surface and a second surface opposite to the first surface, the light receiver including a light receiving region and two soldering portions, wherein the light receiving region and the two soldering portions are arranged on the first surface, and the two soldering portions are respectively arranged at two opposite sides of the light receiving region, and wherein the two soldering portions of the light receiver are respectively soldered on the first die-bonding portion and the second die-bonding portion, such that the light receiving region faces the light entrance; and
        a light-permeable package compound, wherein the first die-bonding portion, the first base portion, the second die-bonding portion, the second base portion, and the light receiver are embedded in the light-permeable package compound; and
    a circuit board, wherein the first exposed portion of the first conductive frame is soldered on the circuit board, and
    wherein the light receiver is configured to receive a light signal traveling through the light-permeable package compound and the light entrance, and is configured to transmit an electrical signal to the circuit board through the first conductive frame, and
    wherein in a cross section of the optical package structure parallel to the light receiving region and passing through the light receiver, a center of a shape of the light receiver is arranged apart from that of the light-permeable package compound.

2. The optical detecting device as claimed in claim 1, wherein the second conductive frame includes a second exposed portion soldered on the circuit board, the second die-bonding portion and the second exposed portion respectively extend from two opposite ends of the second base portion, the light receiver is arranged at one side of the first and second die-bonding portions adjacent to the circuit board, and the second surface of the light receiver faces the circuit board.

3. The optical detecting device as claimed in claim 1, wherein the light receiver is arranged at one side of the first and second die-bonding portions away from the circuit board, the circuit board has a thru-hole, the second conductive frame includes a second exposed portion, the second die-bonding portion and the second exposed portion respectively extend from two opposite ends of the second base portion, the first exposed portion and the second exposed portion are respectively soldered on two portions of the circuit board that are arranged at two opposite sides of the thru-hole, and wherein the light receiving region faces the thru-hole, such that the light receiver is configured to receive a light signal traveling through the thru-hole, the light-permeable package compound, and the light entrance.

4. The optical detecting device as claimed in claim 1, wherein the second conductive frame is not connected to the circuit board, and the second base portion has a cut surface arranged away from the second die-bonding portion and substantially flush with an adjacent outer surface of the light-permeable package compound.

5. The optical detecting device as claimed in claim 4, wherein the optical package structure is fixed on the circuit board only by the first exposed portion, and an angle jointly defined by the light receiving region and the circuit board is within a range of 80-100 degrees.

6. The optical detecting device as claimed in claim 1, wherein the first base portion is in a curved shape, and the light receiver is partially arranged in a space surroundingly defined by the first base portion, and wherein the light receiver is arranged at one side of the first and second die-bonding portions adjacent to the circuit board, and the second surface of the light receiver faces the circuit board.

7. An optical package structure, comprising:
- a first conductive frame including a first base portion, a first die-bonding portion, and a first exposed portion, wherein the first die-bonding portion and the first exposed portion respectively extend from two opposite ends of the first base portion;
- a second conductive frame including a second base portion and a second die-bonding portion extending from the second base portion, wherein the first die-bonding portion and the second die-bonding portion are spaced apart from and substantially coplanar with each other, and the first die-bonding portion and the second die-bonding portion jointly define a light entrance therebetween;
- a light receiver having a first surface and a second surface opposite to the first surface, the light receiver including a light receiving region and two soldering portions, wherein the light receiving region and the two soldering portions are arranged on the first surface, and the two soldering portions are respectively arranged at two opposite sides of the light receiving region, and wherein the two soldering portions of the light receiver are respectively soldered on the first die-bonding portion and the second die-bonding portion, such that the light receiving region faces the light entrance; and
- a light-permeable package compound, wherein the first die-bonding portion, the first base portion, the second die-bonding portion, the second base portion, and the light receiver are embedded in the light-permeable package compound,
- wherein the light receiver is configured to receive a light signal traveling through the light-permeable package compound and the light entrance, and
- wherein in a cross section of the optical package structure parallel to the light receiving region and passing through the light receiver, a center of a shape of the light receiver is arranged apart from that of the light-permeable package compound.

8. The optical package structure as claimed in claim 7, wherein the optical package structure is without any opaque material arranged on an outer surface of the light-permeable package compound.

9. The optical package structure as claimed in claim 7, wherein the optical package structure has no silver glue or metal wire arranged in the light-permeable package compound.

* * * * *